United States Patent [19]
Imai

[11] Patent Number: 5,872,039
[45] Date of Patent: Feb. 16, 1999

[54] SEMICONDUCTOR DEVICE AND MANUFACTURING METHOD OF THE SAME

[75] Inventor: Kiyotaka Imai, Tokyo, Japan

[73] Assignee: NEC Corporation, Tokyo, Japan

[21] Appl. No.: 772,915

[22] Filed: Dec. 24, 1996

[30] Foreign Application Priority Data

Dec. 30, 1995 [JP] Japan .................................. 7-353482

[51] Int. Cl.$^6$ ................................................. H01L 21/336
[52] U.S. Cl. .......................................... 438/291; 438/300
[58] Field of Search .................................... 438/300, 289, 438/291

[56] References Cited

U.S. PATENT DOCUMENTS

| | | |
|---|---|---|
| 4,966,861 | 10/1990 | Mieno et al. . |
| 5,118,639 | 6/1992 | Roth et al. . |
| 5,198,378 | 3/1993 | Rodder et al. . |
| 5,213,991 | 5/1993 | Inokawa et al. . |
| 5,352,631 | 10/1994 | Sitaram et al. . |

FOREIGN PATENT DOCUMENTS

| | | |
|---|---|---|
| 0 430275A3 | 6/1991 | European Pat. Off. . |
| 0 43275A2 | 6/1991 | European Pat. Off. . |
| 41 12 045 A2 | 10/1991 | Germany . |

OTHER PUBLICATIONS

European Search Report, dated Jun. 23, 1997.
"High Performance FET Structure Made Using Medium to Low Temperature Epitaxy", IBM Technical Disclosure Bulletin, vol. 33, No. 11, Apr. 1991, pp. 53–55.
J. M. Sung et al.; "A High Performance Super Self–Aligned 3 V/5 V BiCMOS Technology . . . Applications"; IEEE Transactions on Electron Devices, vol. 42, No. 3, Mar. 1995, pp. 513–522.

*Primary Examiner*—Richard A. Booth
*Attorney, Agent, or Firm*—Whitham, Curtis & Whitham

[57] ABSTRACT

The present invention discloses a MOS transistor which is capable of reducing an area of a diffusion layer of a source and drain, and is capable of reducing the number of manufacturing processes while enhancing flatness of a surface of the device. A selective silicon epitaxial layer is formed in an element region which is defined by an element isolation insulating layer formed in a silicon substrate. In the element isolation insulation layer, a polysilicon layer and a selective polysilicon layer connected to the selective silicon epitaxial layer are formed as a source and drain electrode. An LDD region and a source and drain region are formed in the selective silicon epitaxial layer, and a leading electrode for the source and drain region is formed in the source and drain electrode. The source and drain electrode can be formed by one photolithography process, and a margin between the gate electrode and the element isolation insulating layer can be reduced, whereby an area of a diffusion layer of the source and drain is reduced.

10 Claims, 13 Drawing Sheets

SEMICONDUCTOR DEVICE AND MANUFACTURING METHOD OF THE SAME

BACKGROUND OF THE INVENTION

1. Field of the Invention

The present invention relates to a semiconductor device, more particularly to a structure of a MOS type transistor and a manufacturing method of the same.

2. Description of the Related Art

Attempt to increase an operation speed of transistors has been made as micronization of the transistors processes. Recently, MOS transistors have been developed, which have a gate length less than 0.25 microns. Dimensional limitations to pattern the photoresist has been relieved, thereby advancing micronization of the gate length. However, a contact size, a margin between a contact and a gate, and a margin between the contact and an element isolation insulating layer are not so micronized as a reducing ratio of the gate dimension, whereby reduction in areas of source and drain diffusion layers is difficult. As a result, charging/discharging of capacitances in the source and drain diffusion layers much contributes to an operation speed of the transistors, resulting in producing an obstacle to a high speed operation.

For a method to solve such problems, there has been a method to make reduce source and drain diffusion layer capacitances very small by using an SOI substrate such as a silicon SIMOX. However, there is a problem in the SOI substrate such as the silicon SIMOX that the SOI substrate is inferior to an usual bulk substrate because the SOI substrate is high in cost and has a high density of defects. No SOI substrate has mass-produced yet.

For a method to reduce the source and drain diffusion layer capacitances using the usual bulk substrate, a prior art is disclosed in "A High Performance Super Self-Aligned 3V/5V BiCMOS Technology with Extremely Low Parasitic for Low-Power Mixed-Signal Applications" J. M. Sung et al., IEEE Transaction Electron Devices, Vol. 42, No. 3, 1993, as described below.

First, as shown in FIG. 10(a), a well region 102 is formed on a silicon substrate 101 and an element isolation insulating layer 103 is formed on the silicon substrate 101. Thereafter, a gate oxide film 104 and a gate electrode 105 made of a polysilicon layer is formed sequentially. It should be noted that a nitride film 106 and a polysilicon 105' are stacked on the gate electrode 105. Thereafter, a lightly doped drain ( LDD ) region 107 is formed by injecting impurities into the silicon substrate 105 at a low concentration. Subsequently, as shown in FIG. 10(b), a side wall 108 is formed on a side surface of the gate electrode 105, 106, and 105'. A second polysilicon layer 109 is formed on the entire surface of the resultant structure. The second polysilicon layer 109 is formed so as to contact of a silicon surface of a source and drain formation region.

Next, as shown in FIG. 10(c), the second polysilicon film 109 is subjected to photoresist and etching processes, whereby the film 109 is patterned. Subsequently, as shown in FIG. 10(d), a first photoresist 110 is coated on the entire surface of the resultant structure, whereby the resultant structure is flattened. Furthermore, after a second photoresist 111 is coated on the entire surface of the resultant structure, a portion of the second photoresist 111 located above the gate electrode 105 is removed to form a opening.

Subsequently, as shown in FIG. 10(e), an anisotropic etching is performed so that a thinner portion of the first photoresist 110 is removed. Hence, the second polysilicon 109 is etched. At this time, a portion of the second polysilicon 109 located outside the side wall 108 is sufficiently removed to be over-etched. As a result, the polysilicon 105' on the gate electrode 105 made of the polysilicon is also etched using the nitride film 106 as an etching stopper. Hence, the second polysilicon 109 connecting the source and the drain is divided to two parts interposing the gate electrode 105, each being separated from one another. Thereafter, the nitride film 106 is removed, and an ion injection is performed to form source and drain regions. Then, a thermal treatment for an activation is performed whereby the source and drain regions 112 are formed. Thus, contacts for the source and drain regions 112 are realized through each portion of the second polysilicons 109, respectively, whereby each area of diffusion layers of the source and the drain regions 112 can be made smaller and each diffusion capacitance of them can be reduced greatly.

There has been the problem in the conventional technology that manufacturing processes are very complicated, although the conventional technology can extremely reduce the areas of the diffusion layers of the source and the drain regions. Particularly, two photolithography processes are needed to form the polysilicon electrodes 109 for contacting the source and the drain regions 112 to the outside, and a flattening process using a photoresist is needed. Moreover, as to a structure of this transistor, the side wall 108 displaying a projection shape is left. When a resistor element and alminium wiring, and the like are formed on this transistor, there is a problem that cutting-off of a circuit is caused due to a deterioration of step coverage contributed owing to the projection of the side wall 108.

SUMMARY OF THE INVENTION

The object of the present invention is to provide a semiconductor device which is capable of reducing areas of diffusion layers of source and drain regions to reduce capacitances thereof, and a manufacturing method of the same which is capable of simplifying manufacturing steps.

A first aspect of a semiconductor device of the present invention comprises, a silicon substrate;

an element isolation insulating layer formed on the silicon substrate to isolate element regions;

a selective silicon epitaxial layer formed on a surface of the silicon substrate located in each element region;

a polysilicon layer and a selective polysilicon layer, each being formed on the element isolation insulating layer and connected to said selective epitaxial layer;

a gate insulating film formed on said selective silicon epitaxial layer;

a gate electrode formed on the gate insulating film;

an LDD side wall formed on a side surface of said gate electrode, the side wall having a film thickness slightly thinner than an interval between the gate electrode and the element isolation insulating layer;

source and drain regions formed in a region including at least said selective silicon epitaxial layer;

a silicide layer formed on surfaces of said gate electrode, selective polysilicon layer, and selective silicon epitaxial layer; and leading electrodes for the source and drain regions, each being connected to silicide of said polysilicon layer.

A second aspect of a semiconductor device of the present invention comprises, a silicon substrate;

an element isolation insulating layer formed on the silicon substage to isolate element regions;

a selective silicon epitaxial layer formed on a surface of the silicon substrate located in each element region;

a polysilicon layer formed on said element isolation insulating layer, said polysilicon layer being connected to said selective silicon epitaxial layer;

a gate insulating film formed on said selective silicon epitxial layer;

a gate electrode formed on the gate insulating film;

an LDD side wall formed on a side surface of said gate electrode, the side wall having a film thickness thicker than an interval between said gate electrode and said element isolation insulating layer;

an LDD region formed in said selective silicon epitaxial layer;

a silicide layer on surfaces of said gate electrode and a selective polysilicon layer; and leading electrodes for source and drain regions, each being connected to a silicide of said selective polysilicon layer.

A manufacturing method of a semiconductor device of the present invention comprises the steps of, forming element isolation insulating layers on a silicon substrate to form element regions, said element regions being isolated from each other by said element isolation insulating layers;

selectively forming a polysilicon layer on said element isolation insulating layer adjacent to source and drain regions, said source and drain regions being formed on said element regions;

selectively forming a silicon epitaxial layer on said element region and simultaneously forming a selective polysilicon layer on said polysilicon layer;

sequentially forming a gate insulating film and a gate electrode in said element region;

injecting impurities into said source and drain regions utilizing said element isolation insulating layer and said gate electrode to form an LDD region;

forming an LDD side wall on a side surface of said gate electrode;

injecting impurities utilizing the LDD side wall;

converting at least surfaces of said gate electrode and said selective polysilicon layer to silicide;

forming an interlayer insulating layer on the entire surface of the resultant structure;

forming openings in said interlayer insulating layer; and forming leading electrodes for said source and drain regions in said openings, each leading electrode being connected to said selective polysilicon layer.

BRIEF DESCRIPTION OF THE DRAWINGS

For a more complete understanding of the present invention and the advantages thereof, reference is now made to the following description taken in conjunction with the accompanying drawings, in which.

DETAILED DESCRIPTION OF THE PREFERRED EMBODIMENTS

Embodiments of the present invention will be described with reference to the accompanying drawings.

Figure 1A:
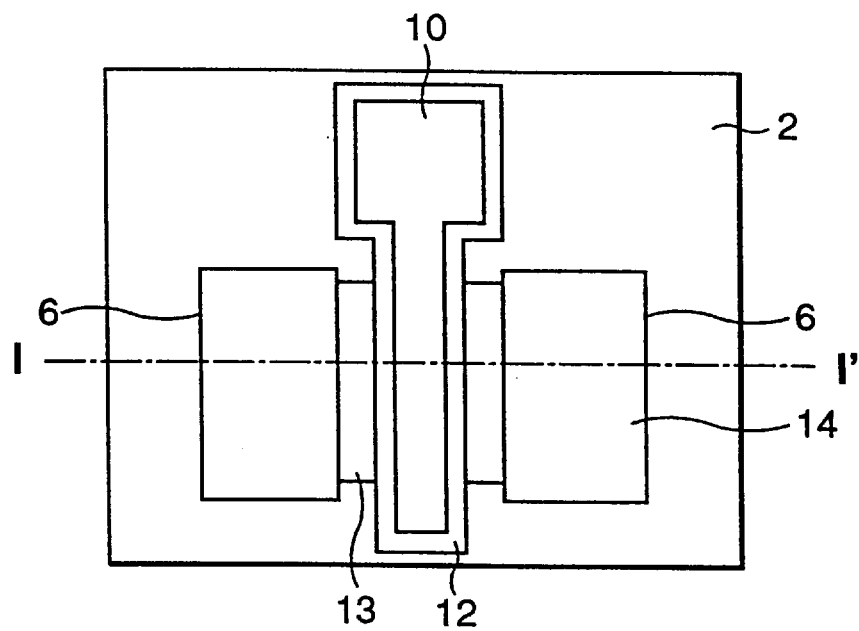
FIG. 1(a) is a plan view of a first embodiment of a semiconductor device of the present invention.
Figure 1B:
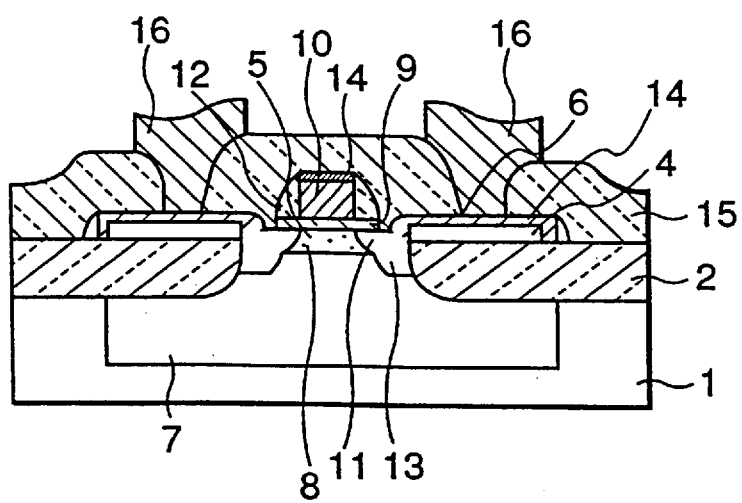
FIG. 1(b) is a sectional view along a A–A' line shown in FIG. 1(a) of the first embodiment of the semiconductor device of the present invention.

FIGS. 1(a) and 1(b) are a plan view of a first embodiment of a MOS transistor of the present invention and a sectional view thereof. Next, a description for a device structure will be made using FIGS. 1(a) and 1(b). Referring to FIGS. 1(a) and 1(b), an element isolation insulating layer 2 is formed on a silicon substrate 1 of one conductivity type. An element region is surrounded by the element isolation insulating layer 2. Then, a well region 7 is formed in the substrate 1 corresponding to the element region 7. A gate oxide film 9 and a gate electrode 10 are sequentially formed on a surface of the silicon substrate 1 corresponding to the element region. An LDD side wall 12 is formed o a side surface of the gate electrode 10, and a titanium silicide ( TiSi ) layer 14 is formed on an upper surface thereof. Further, a selective silicon epitaxial layer 5 is formed on a surface of the silicon substrate 1 in the element region. A polysilicon layer 4 and a selective polysilicon layer 6 are formed outside the selective silicon epitaxial layer 5 in a form that the selective polysilicon layer 6 is stacked on the polysilicon layer 4. A channel doped layer 8 is formed in a portion of the selective silicon epitaxial layer 5 just below the gate electrode 10. An LDD region 11 is formed on both sides of the channel doped layer 8. Source and drain region 13 is formed in the selective silicon epitaxial layer 5 and the silicon substrate 1, which are located between the periphery of the LDD region 11 and the element isolation insulating layer 2. Furthermore, a TiSi layer 14 is formed on a surface of the selective polysilicon layer 6. The TiSi layer 14 and the polysilicon layer 4 constitute an electrode of the source and drain region. Then, an interlayer insulating layer 15 is formed on the entire surface of the resultant structure. A contact is formed in the interlayer insulating layer 15 whereby a leading electrode 16 connected to the source and drain electrode is formed.

In this embodiment, a dimension of an interval between the element isolation insulating layer 2 and both of the gate electrode 10 and the LDD side wall 12 can be set small, whereby an area of a diffusion layer of the source and drain region 13 can be reduced. The source and drain region 13 is connected to the polysilicon layer 5 and the selective polysilicon layer 6 via the selective silicon epitaxial layer 5, and the leading electrode for the source and drain region is formed on the polysilicon layer 4 and the selective polysilicon layer 6. Therefore, a margin between the gate electrode 10 and the element isolation insulating layer 2 can be extremely reduced, whereby the areas of the diffusion layer of the source and drain region 13 can be greatly reduced. As a result, a diffusion capacitance can be greatly reduced in comparison with a transistor of a structure that an area of a source and drain diffusion layer is not reduced. It was confirmed that an operation speed of the semiconductor device of this embodiment increases by 20%. In addition, the channel doped layer 8 is formed in the selective silicon epitaxial layer 5 just below the gate electrode 10 so that a short-circuit between the source and the drain is prevented. Furthermore, no projection is present in the LDD side wall of this embodiment, in comparison with that which that of the conventional semiconductor device, whereby a cut-off of the circuit due to a deterioration of step coverage can be prevented.

Next, manufacturing steps of the MOS transistor shown in FIG. 1 will be described with reference to FIGS. 2(a) to 2(f) and FIGS. 3 to 4, according to a step sequence.

Figure 2A:
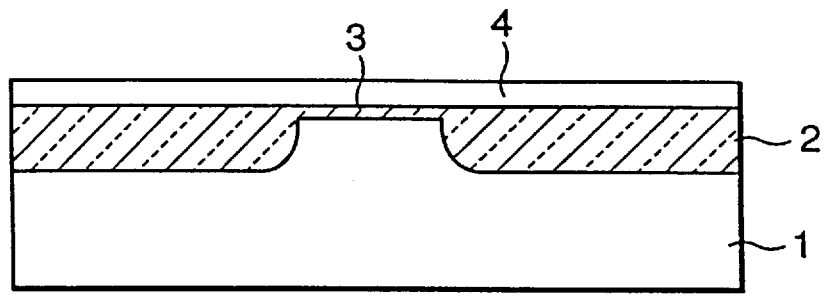
FIG. 2(a) to FIG. 2(f) are sectional views showing manufacturing steps of the first embodiment of the semiconductor device of the present invention and FIG. 2(g) is an enlarged view of portion of FIG. 2(b)
Figure 2B:
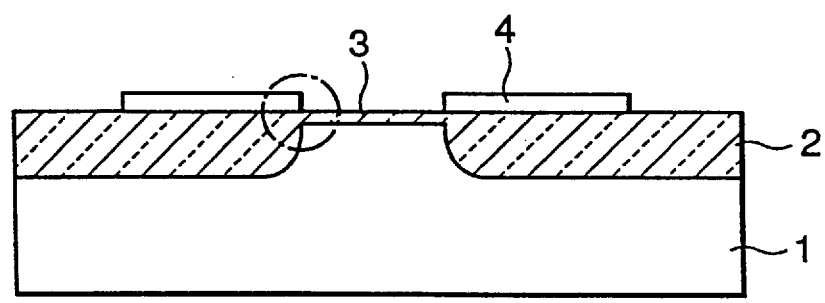

First, as shown in FIG. 2(a), an insulating layer 2 for a element isolation is formed on a silicon substrate 1 by means of a recess LOCOS method. Thereafter, a silicon oxide film 3 of 5 to 20 nm of a film thickness is formed. Further, a polysilicon layer 4 of 50 to 100 nm of a film thickness is grown on the entire surface of the resultant structure. Subsequently, as shown in FIG. 2(b), the polysilicon layer 4 is patterned using a photolithography step the encircled area being shown in more detail in FIG.2(g). At this time, as shown in a plan view of FIG. 3, the polysilicon layer 4 is patterned on the element isolation insulating layer 2 such that the patterned layer 4 is along a boundary between the element isolation insulating layer 2 and the element region for formation of a transistor, and one of sides thereof is adjacent to a source and drain formation region and is in parallel with the gate electrode 10. In this patterning, as shown in FIG. 2(b), an edge of the polysilicon layer 4 is set inside by 0 to 0.1 micron from that of the element isolation insulating layer 2. It should be noted that the silicon oxide film 3 serves as a stopper at the time of etching the polysilicon layer 4.

Figure 2C:
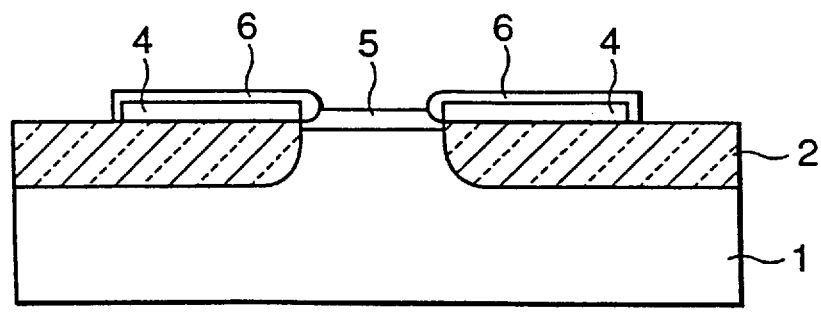
Figure 4:
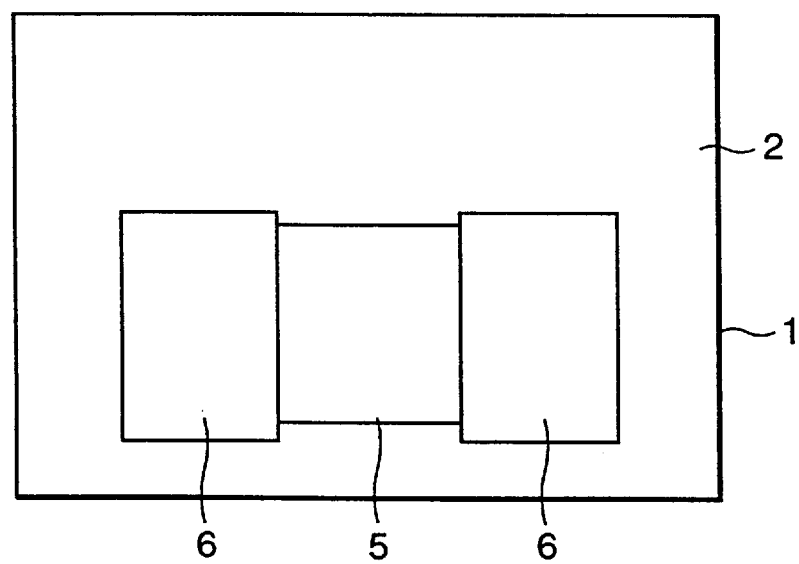
FIG. 4 is a plan view of FIG. 2(c)

Next, as shown in FIG. 2(c) and FIG. 4, after the silicon oxide film 3 is removed using a wet etching liquid or the like, a silicon epitaxial layer 5 is selectively grown on a surface of the silicon substrate 1. A film thickness of the silicon epitaxial layer 5 is 30 to 100 nm. At the same time when the silicon epitaxial layer 5 is grown, a selective polysilicon layer 6 is grown both on a surface of the polysilicon layer 4 and on a periphery of the polysilicon layer 4. A film thickness of the selective polysilicon layer 6 grown on the polysilicon 4 is about ½ to ¼ of the film thickness of the silicon epitaxial layer 5. This is because the a surface index of polysilicon layer is (111) in comparison with a surface index (100) of the silicon surface so that a silicon growth speed on the surface (111) is slow. The silicon epitaxial layer 5 selectively grown on the surface of the silicon substrate 1 can be formed in a structure that the layer 5 is connected to a side surface of the polysilicon layer 4 and the selective polysilicon layer 6.

Figure 2D:
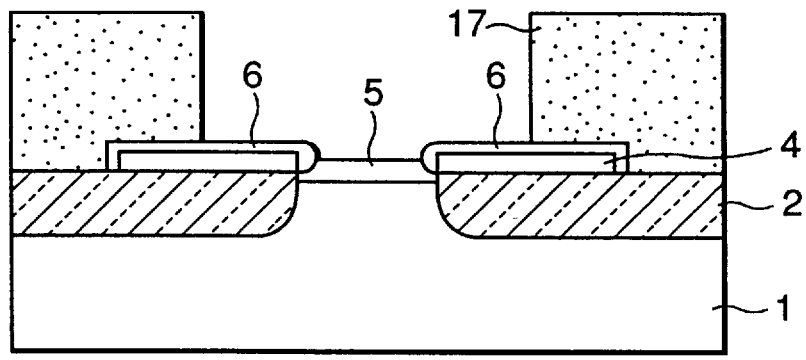
Figure 2E:
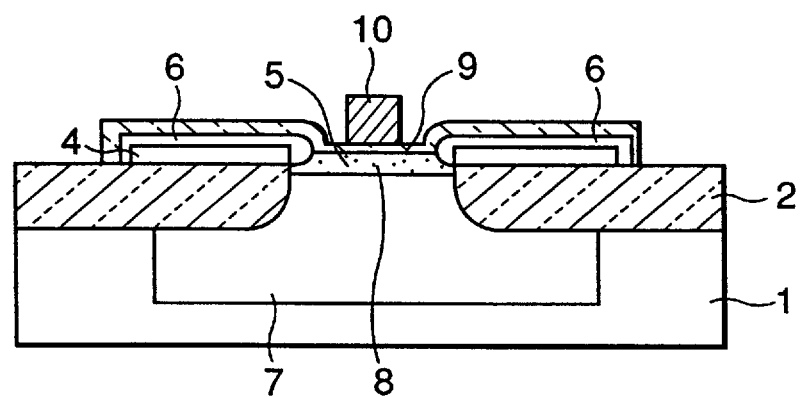
Figure 5:
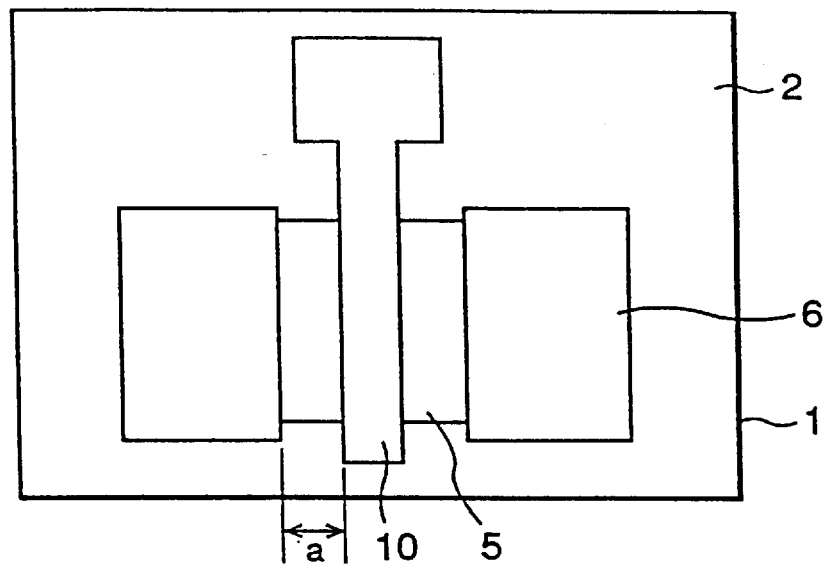
FIG. 5 is a plan view of FIG. 2(e)

Subsequently, as shown in FIG. 2(d) and FIG. 2(e), ion injection is performed using a photoresist 17 as a mask whereby a well region 7 is formed. Further, ion injection for controlling a threshold value of the device of the present invention is performed whereby a channel doped layer 8 is formed. This ion injection is performed under the conditions of an accerelation voltage of 20 to 30 KeV and an impurity concentration of boron of $5 \times 10^{12}$ to $1 \times 10^{13}$ cm$^{-2}$ in the case of an N channel MOS transistor. Subsequently, as shown in FIG. 2(e), after the photoresist 17 is removed, a gate thermal oxide film 9 is formed on surfaces of the silicon epitaxial layer 5 and the selective polysilicon layer 6. Thereafter, a gate electrode 10 made of polysilicon of a film thickness 10 to 20 nm is formed on the gate oxide film 9 by patterning. At this time, as shown a plan view of FIG. 5, a distance a between the gate electrode 10 and the element isolation insulating layer 2 is set at about 0.2 to 0.4 micron.

Figure 2F:
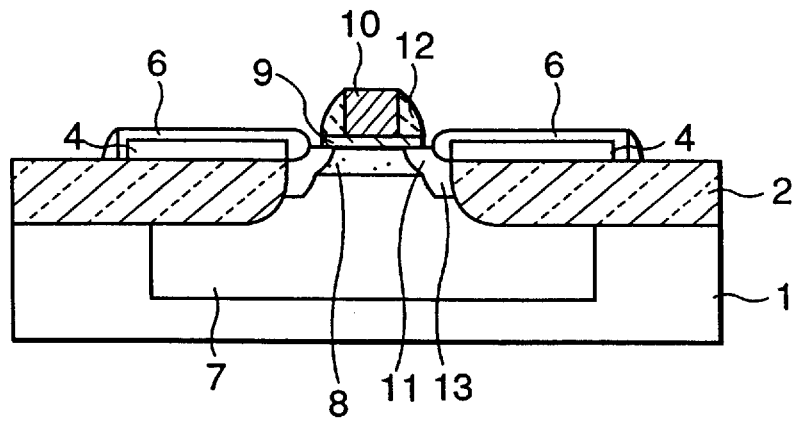
Figure 2G:
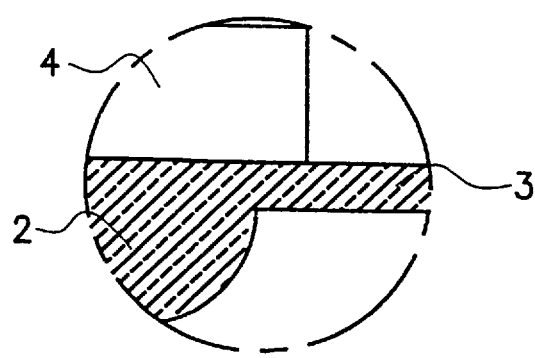
Figure 3:
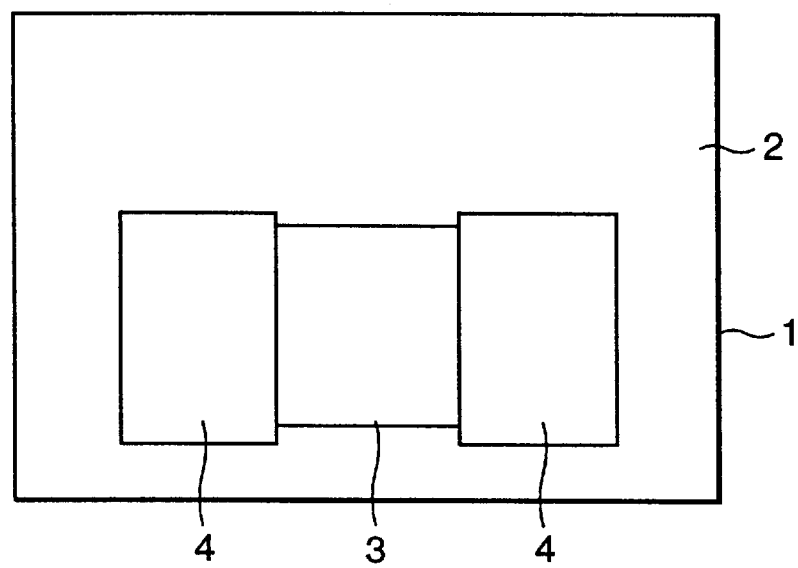
FIG. 3 is a plan view of FIG. 2(b)

Next, as shown in FIG. 2(f), after an LDD region 11 is formed by injecting impurities at a low concentration, a side wall 12 is formed on a side surface of the gate electrode 10. Further, after ion injection for forming source and drain regions is performed, the source and drain regions 13 are formed by performing a thermal treatment for activation. In such situation, as shown in FIG. 1(b), after silicide, e.g. TiSi in this embodiment, is formed by sputtering, surfaces of the gate electrode 10, the selective polysilicon layer 6, and the polysilicon layer 4 beneath the layer 6 are converted into silicide. Thereafter, an interlayer insulating layer 15 is formed. Openings are formed, and then leading electrodes 16 for the source and drain regions are formed whereby the MOS transistor is completed.

According to the manufacturing method of this embodiment, the structure of the transistor and the manufacturing process are simplified in comparison with those of the conventional device. Particularly, two photography processes were needed in the conventional device in order to form the polysilicon electrode composed of the polysilicon layer 4 and the selective polysilicon layer 6 as the electrodes for the source and drain regions. Contrary to this, in this embodiment, it is possible to form the polysilicon electrode by performing only one lithography process, whereby facility of the manufacturing process can be realized.

Figure 6A:
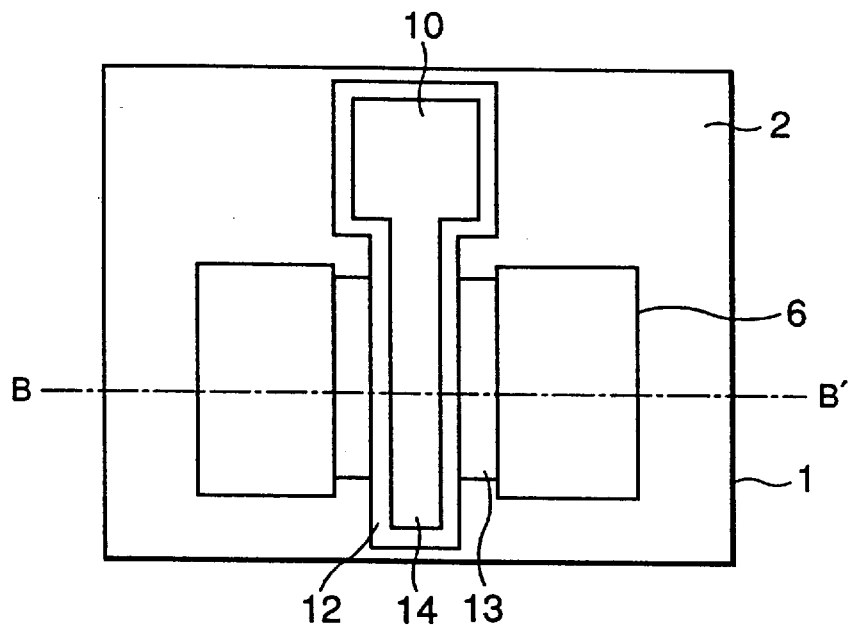
FIG. 6(a) is a plan view of a second embodiment of a semiconductor device of the present invention.
Figure 6B:
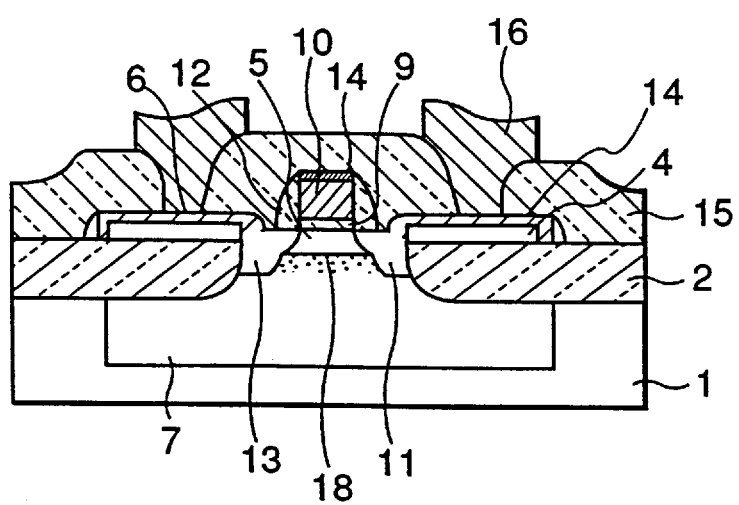
FIG. 6(b) is a sectional view along a B–B' line shown in FIG. 6(a) of the second embodiment of the present invention.

FIGS. 6(a) and 6(b) are a plan view of a second embodiment of a MOS transistor of the present invention and a sectional view of the same, respectively. The same reference numerals are given to the same portions of the MOS transistor of the first embodiment. In the second embodiment, no channel doped layer is present in a selective silicon epitaxial layer 5 just below a gate electrode 10. A delta doped layer 18 is present in the silicon substrate 1 just below the selection silicon epitaxial layer 5, whereby a punch-through between the source and drain regions is prevented. A impurity concentration of the delta doped layer 18 is high so that it is three to ten times that of the well region 7 in the device of the first embodiment. It should be noted that although such delta doped layer 18 of a high impurity concentration is present, the selective silicon epitaxial layer 5 of a low impurity concentration is present on the delta doped layer 18 so that a threshold value never increases.

Then, a polysilicon layer 4 and a selective polysilicon layer 6 are connected to the selective silicon epitaxial layer 5, and a contact leading electrode 16 for source and drain region is connected to an electrode made of the polysilicon layers 4 and 6. Therefore, a margin between the gate electrode 10 and the element isolation insulating layer 2 can be reduced like the first embodiment, whereby an area of a diffusion layer of the source and drain is greatly reduced. Thus, an operation speed of the device of this embodiment can be increased. Moreover, no projection of the LDD side wall is present, so that a cutting-off of a circuit due to a deterioration of step coverage can be prevented.

Figure 7A:
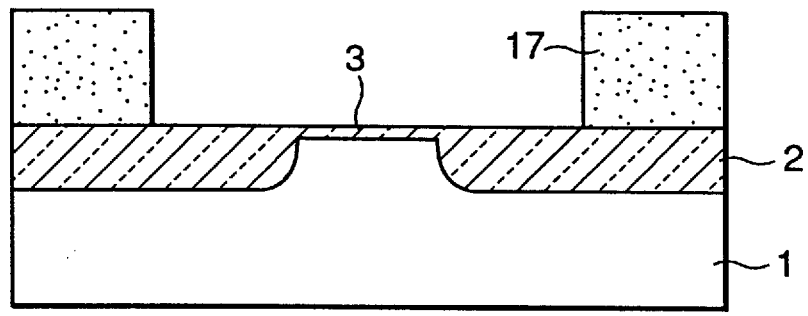
FIGS. 7(a) to 7(f) are sectional views showing manufacturing steps of the second embodiment of the semiconductor device of the present invention.
Figure 7B:
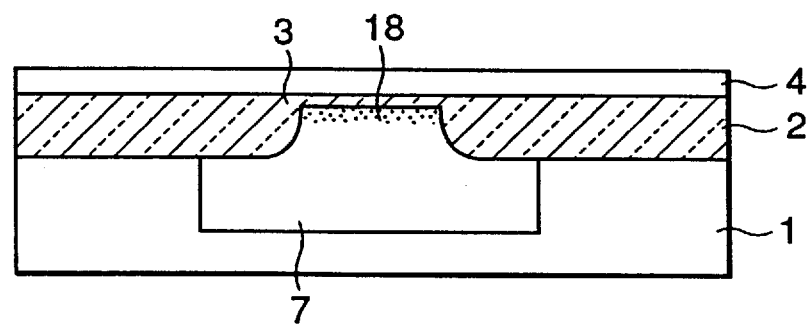

FIGS. 7(a) to 7(f) show manufacturing processes of the MOS transistor shown in FIGS. 6(a) and 6(b), in the order of manufacturing steps. In this embodiment, referring to FIG. 7(a), the insulating layer 2 for element isolation is formed on the silicon substrate 1. A silicon oxide film 3 of 5 to 20 nm thick is formed on a silicon substrate 1. Thereafter, a mask 17 is formed, and, as shown in FIG. 7(b), a well region 7 is formed by performing ion injection. Further, ion injection is performed to form a delta doped layer 18 in order to prevent a punch-through between source and drain regions. The delta doped layer 18 is formed by the ion injection with lower energy, in comparison with that in the ion injection for forming the channel doped layer 8 of the first embodiment. Therefore, the delta doped layer 18 has a steep impurity profile. For example, when an N channel MOS transistor is formed, boron is injected at an acceleration voltage of 5 to 10 keV and at an impurity concentration of $5 \times 10^{12}$ to $2 \times 10^{13}$ cm$^{-2}$ or BF$_2$ is injected at an acceleration voltage of 10 to 30 KeV and at an impurity concentration of $5 \times 10^{12}$ to $2 \times 10^{13}$ cm$^{-2}$. The threshold value is determined depending on the concentration of the delta doped layer 18 and the film thickness of the low concentration selective silicon epitaxial layer 5 which is formed after formation of the delta doped layer 18. Thereafter, a polysilicon layer 4 of 50 to 100 nm is formed on the entire surface of the resultant structure.

Figure 7C:
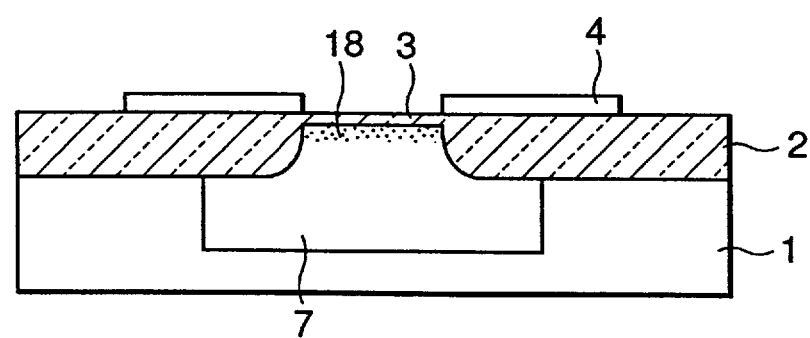
Figure 7D:
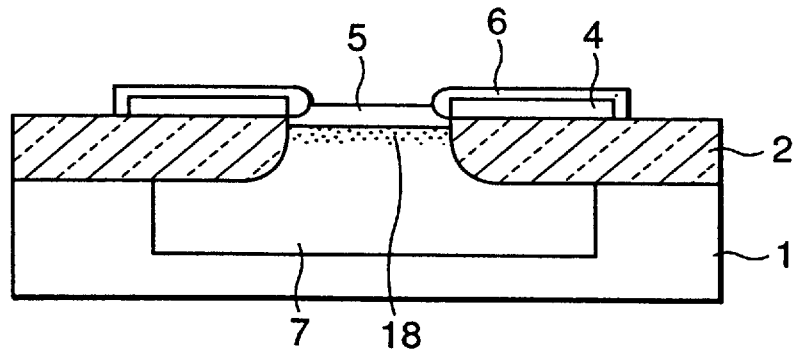
Figure 7E:
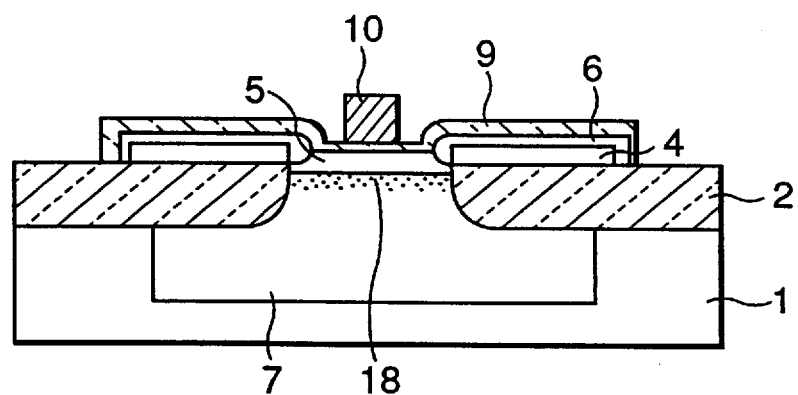
Figure 7F:
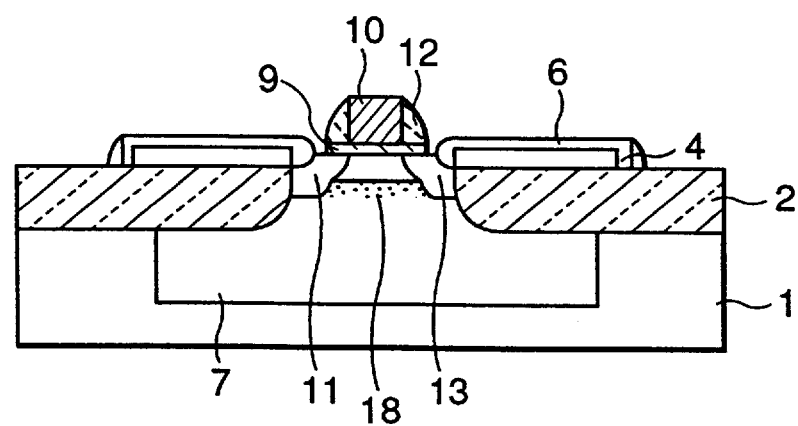

The following manufacturing steps are the same as those of the first embodiment. As shown in FIGS. 7(c), 7(d), 7(e), and 7(e), the manufacturing steps of the second embodiment are different from those of the first embodiment in that a channel doped layer is not formed in the selective silicon epitaxial layer 5. It should be noted that as shown in FIG. 7(d), the selective silicon epitaxial layer 5 selectively formed on the surface of the silicon substrate 1 after removal of the silicon oxide film 3 has a film thickness of 30 to 60 nm.

Also in the manufacturing method of the second embodiment of the present invention, one photolithography process to form the polysilicon electrode serving as the source and drain regions may well do, in comparison with those of the conventional manufacturing method. Thus, it is possible to reduce the number of the manufacturing steps.

Figure 8A:
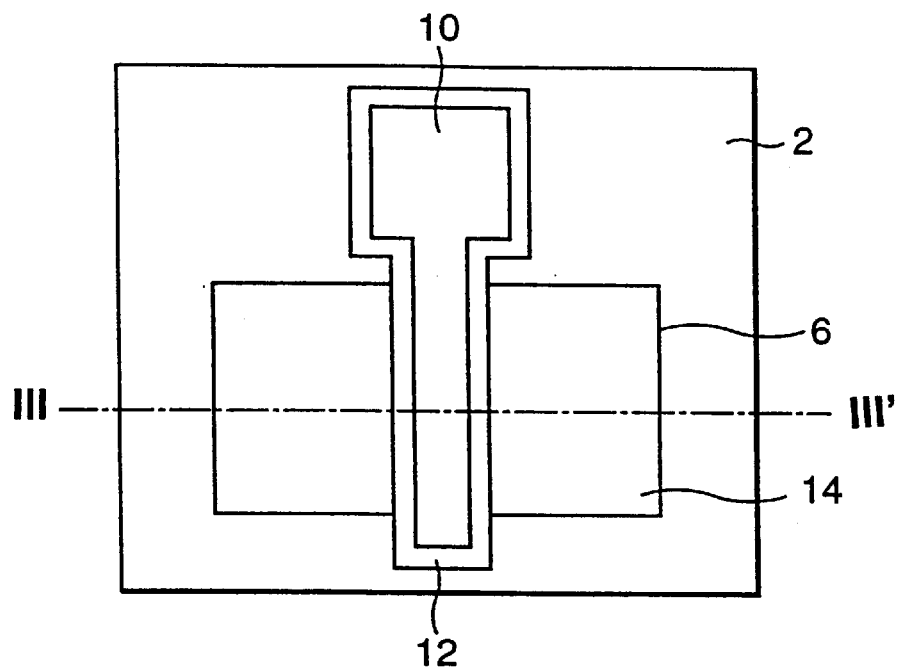
FIG. 8(a) is a plan view of a third embodiment of a semiconductor device of the present invention.
Figure 8B:
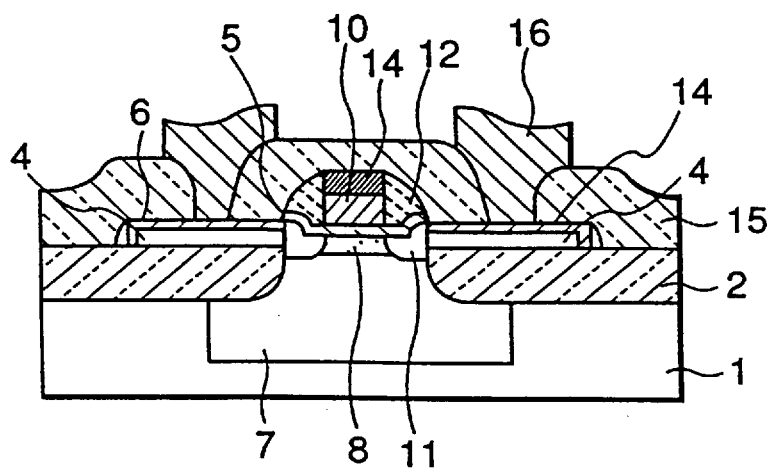
FIG. 8(b) is a sectional view along a C–C' line shown in FIG. 8(a) of the third embodiment of the semiconductor device of the present invention.

FIGS. 8(a) and 8(b) are a plan view of a MOS transistor of a third embodiment of the present invention and a section view of the same. In this embodiment, a distance between the gate electrode 10 and the element isolation insulating layer 2 is set smaller than a width of the LDD side wall 12, whereby a transistor is manufactured without forming source and drain regions of a high impurity concentration. Specifically, only the LDD region 11 of a low impurity concentration is formed in the silicon substrate 1, and the LDD region 11 is connected to the polysilicon layer 4 and the selective polysilicon layer 6 which are converted into silicide. The leading electrodes 16 for the source and drain regions are connected to the polysilicon layers 4 and 6. Hence, the contact is completed.

In this MOS transistor, since a source and drain regions 13 of a high impurity concentration are not formed in the silicon substrate 1, a punching-through characteristic between the source and drain regions can be improved significantly. In addition, the silicide layer is formed only on the selective polysilicon layer 6, the polysilicon layer 4, and the gate electrode 10, and the silicide is not formed on the silicon substrate 1. As a result, a problem that the silicide layer reaches a junction portion between the source and drain and the well region resulting in an occurrence of a leak current is solved. Also in this embodiment, the punching-thorough characteristic is further improved by using the delta doped layer like the second embodiment.

Figure 9A:
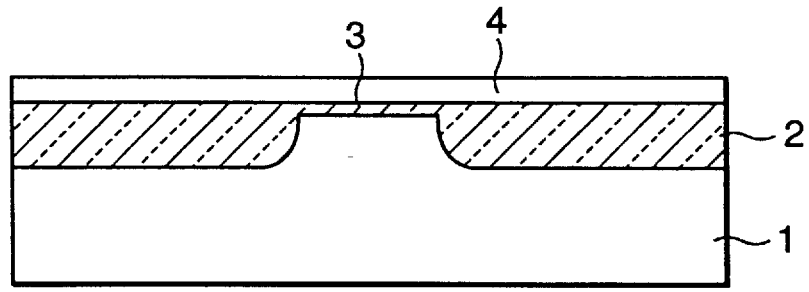
FIGS. 9(a) to 9(f) are sectional views showing manufacturing steps of the third embodiment of the semiconductor device of the present invention.
Figure 9B:
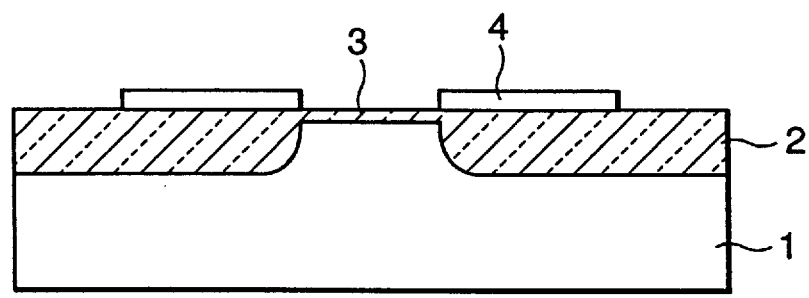
Figure 9C:
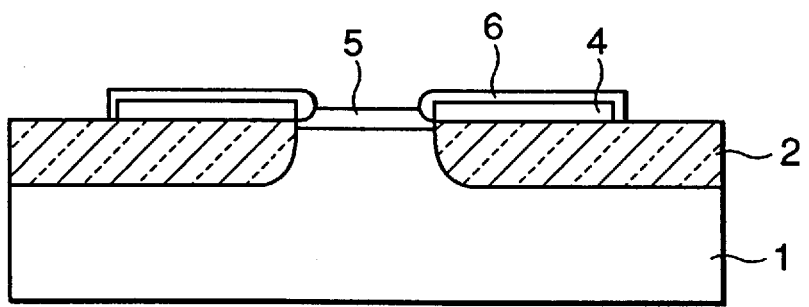
Figure 9D:
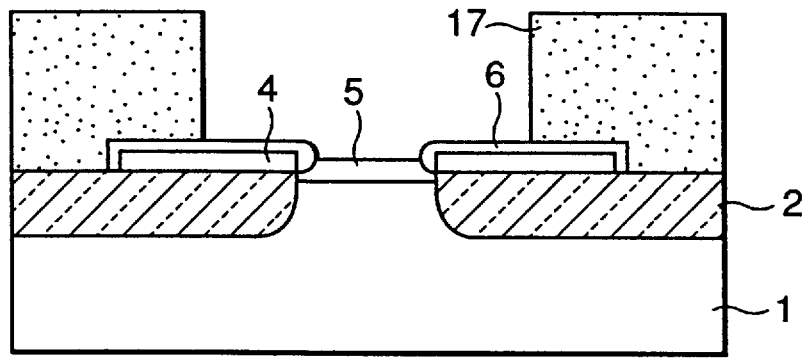
Figure 9E:
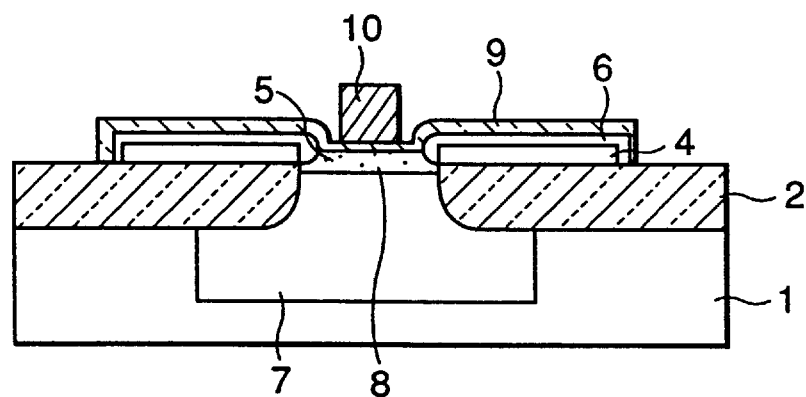
Figure 9F:
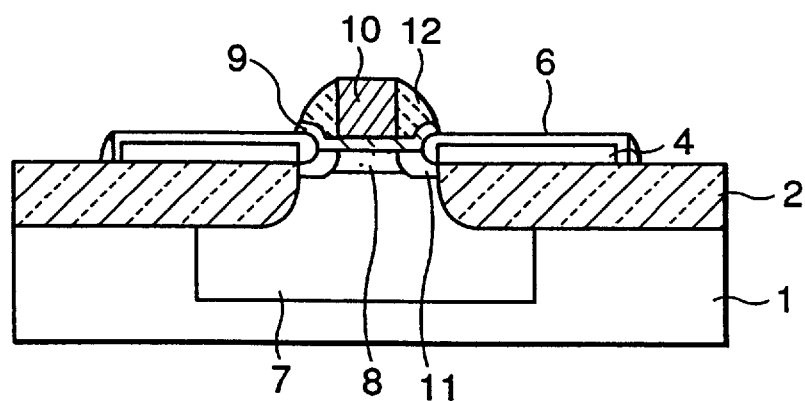
Figure 10A:
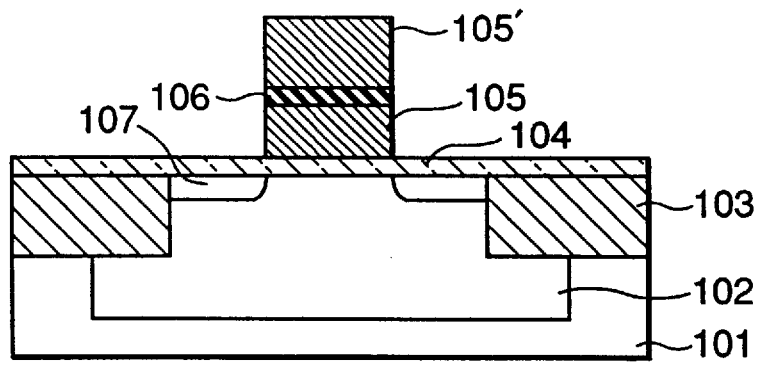
FIGS. 10(a) to 10(e) are sectional views showing manufacturing steps of a conventional semiconductor device.
Figure 10B:
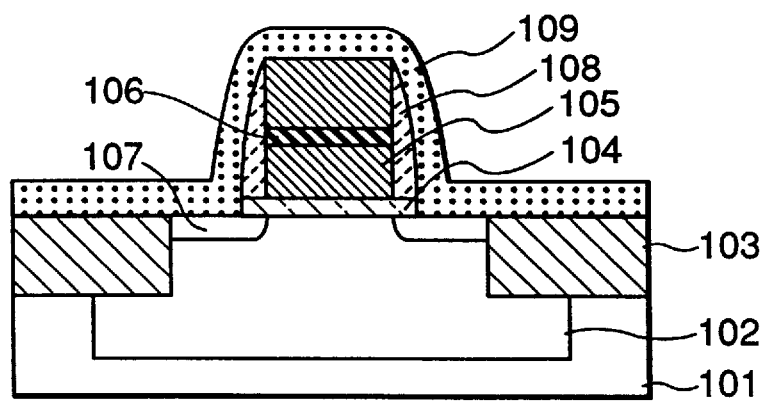
Figure 10C:
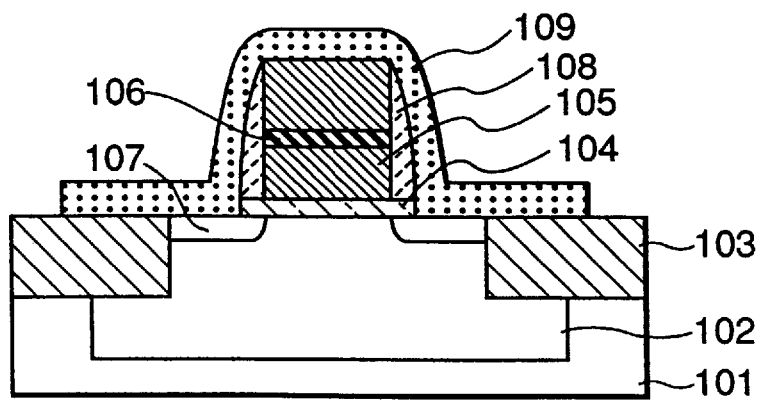
Figure 10D:
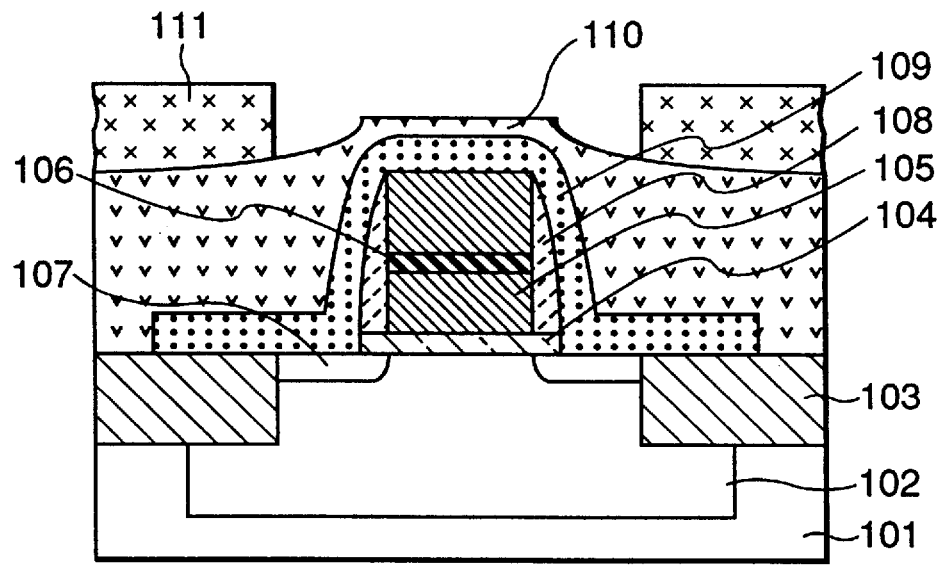
Figure 10E:
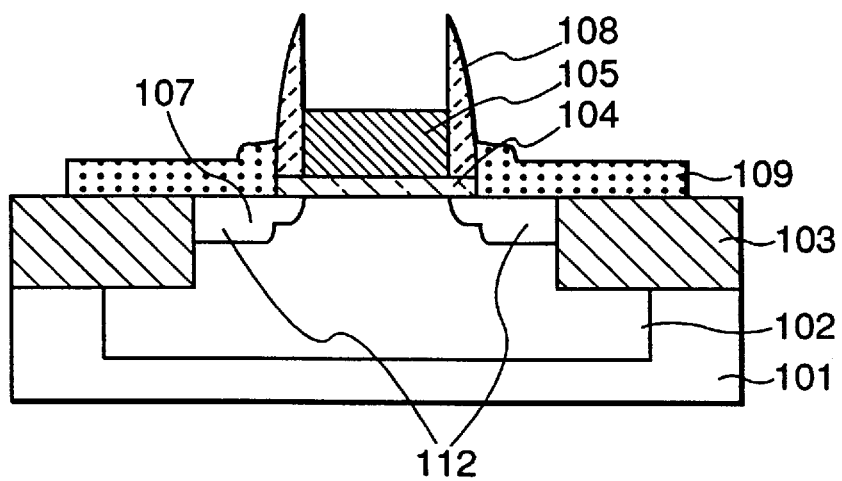

The manufacturing method of this embodiment is shown as illustrated in FIGS. 9(a) to 9(f). The manufacturing method of this embodiment is basically the same as that of the first embodiment shown in FIGS. 2(a) to 2(f). Therefore, the detailed description of the manufacturing method of the third embodiment is omitted. However, it should be noted that a distance between the gate electrode 10 and the element isolation insulating layer 2 shown in FIG. 9(e) is set at 0.1 to 0.2 micron. Moreover, it should be noted that as shown in FIG. 9(f), a width of the LDD side wall 12 is set equal to a distance between the gate electrode 10 and the element isolation insulating layer 2 or larger than that. As a result, when an ion injection for the source and drain regions is performed, impurities are injected only into the selective polysilicon layer 6, the polysilicon layer 4, and the gate electrode 10. Thus, the structure that the source and drain regions are not formed on the surface of the silicon substrate can be obtained. It should be noted that as shown in FIG. 8(a), the LDD region 11 is led out by the selective polysilicon layer 6 and the polysilicon layer 14 which are converted to titanium silicide.

As described above, according to the present invention, the selective silicon epitaxial layer is provided just below the gate electrode. The polysilicon layer connected to the selective silicon epitaxial layer is provided on the element isolation insulating layer. The LDD region and the source and drain regions are formed in the selective silicon epitaxial layer. The leading electrode for the source and drain regions is connected to the polysilicon layer. With such structure, a margin between the gate electrode and the element isolation insulating layer can be greatly reduced, whereby an area of the diffusion layer of the source and drain regions is significantly reduced. Thus, a diffusion capacitance can be reduced. Moreover, no projection of the side wall is present as in the conventional device, so that a cutting-off of the circuit due to a deterioration of step coverage can be prevented.

Furthermore, according to the present invention, the polysilicon electrode serving as source and drain electrodes can be formed only by one lithography process. An increase in the number of the manufacturing steps can be suppressed compared with the conventional manufacturing method where two lithography processes are needed to form the polysilicon electrode. Thus, the device of the present invention can be manufactured easily.

Although the preferred embodiments of the present invention has been described in detail, it should be understood that various changes, substitutions and alternations can be made therein without departing from spirit and scope of the inventions as defined by the appended claims.

What is claimed:

1. A manufacturing method of a semiconductor device comprising the steps of:
   a step of forming an element isolation insulating layer on a semiconductor substrate of a first conductivity type to form an element region surrounded by said element isolation insulating layer;
   a step of selectively forming a first polysilicon layer on said element isolation insulating layer;
   a step of selectively growing a silicon epitaxial layer on said element region, and simultaneously and selectively growing a second polysilicon layer on said first polysilicon layer;

a step of forming a gate electrode at a specified position of said element region;

a first ion injection step of introducing impurities of a second conductivity type into said silicon epitaxial layer using said element isolation insulating layer and said gate electrode as a mask, thereby forming an LDD region;

a step of forming a side wall insulating film on a side surface of said gate electrode; and a second ion injection step of introducing impurities of the second conductivity type using said side wall insulating film as a mask.

2. The manufacturing method according to claim 1, wherein the energy of said second ion injection step is larger than that of said first ion injection step.

3. The manufacturing method according to claim 2 further comprising a step of converting said gate electrode, said silicon epitaxial layer, and said first and second polysilicon layers into silicide layers.

4. The manufacturing method according to claim 3, wherein a film thickness of said side wall insulating film is smaller than a distance between said element isolation insulating layer and said gate electrode.

5. The manufacturing method according to claim 4 further comprising a step of forming a channel doped layer of the first conductivity type in said silicon epitaxial layer.

6. The manufacturing method according to claim 4 further comprising a step of forming a delta doped layer of the first conductivity type in a portion of said silicon substrate just below said silicon epitaxial layer.

7. The manufacturing method according to claim 3, wherein a film thickness of said side wall is larger than a distance between said element isolation insulating layer and said gate electrode.

8. The manufacturing method according to claim 7 further comprising a step of forming a channel doped layer of the first conductivity type in said silicon epitaxial layer.

9. The manufacturing method according to claim 7 further comprising a step of forming a delta doped layer of the first conductivity type in a portion of said silicon substrate just below said silicon epitaxial layer.

10. The manufacturing method according to claim 1 further comprising a step of forming a delta doped layer of the first conductivity type in a portion of said silicon substrate just below said epitaxial semiconductor layer.

* * * * *